(12) United States Patent
Hung et al.

(10) Patent No.: US 7,506,435 B2
(45) Date of Patent: Mar. 24, 2009

(54) MANUFACTURING METHOD OF A MULTI-LAYER CIRCUIT BOARD WITH AN EMBEDDED PASSIVE COMPONENT

(75) Inventors: Ching-Fu Hung, Kaohsiung (TW); Yung-Hui Wang, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 613 days.

(21) Appl. No.: 11/180,596

(22) Filed: Jul. 14, 2005

(65) Prior Publication Data

US 2006/0063301 A1 Mar. 23, 2006

(30) Foreign Application Priority Data

Sep. 21, 2004 (TW) .............................. 93128632 A

(51) Int. Cl.
*H05K 3/30* (2006.01)
(52) U.S. Cl. .............................. 29/832; 29/825; 29/830; 29/846; 29/852
(58) Field of Classification Search .................. 29/825, 29/830, 832, 846, 852
See application file for complete search history.

(56) References Cited

U.S. PATENT DOCUMENTS 4,640,010 A * 2/1987 Brown .......................... 29/832
5,094,969 A * 3/1992 Warren ......................... 29/830

FOREIGN PATENT DOCUMENTS

JP          4-283999        * 10/1992

* cited by examiner

*Primary Examiner*—C. J Arbes
(74) *Attorney, Agent, or Firm*—Bacon & Thomas PLLC

(57) ABSTRACT

A manufacturing method of a multi-layer circuit board with an embedded passive component includes providing a single layer plate having a dielectric layer and a first conductive foil, heating the single layer plate to melt the dielectric layer, pressing a passive component into the second surface of melting dielectric layer, stacking the single layer plate on a core substrate, stacking a second conductive foil on single layer plate, and forming electrical pattern on the second conductive foil. The dielectric layer has a first surface and a second surface. The first conductive foil is disposed on the first surface.

16 Claims, 6 Drawing Sheets

MANUFACTURING METHOD OF A MULTI-LAYER CIRCUIT BOARD WITH AN EMBEDDED PASSIVE COMPONENT

This application claims the benefit of Taiwan application Serial No. 93128632, filed Sep. 21, 2004, the subject matter of which is incorporated herein by reference.

BACKGROUND OF THE INVENTION

1. Field of the Invention

The invention relates in general to a manufacturing method of a multi-layer circuit board, and more particularly to a manufacturing method of a multi-layer circuit board with an embedded passive component.

2. Description of the Related Art

The object of creating a larger space within a substrate area with limited space and enhancing the multi-functions of the module is normally achieved by reducing size or embedding a passive component so that more space can be used for the installation of active components. And, the multi-layer circuit board with a passive component is thus invented and provided. The above passive component can be components such as resistor, capacitor, inductor and voltage controlled quartz oscillator.

Many methods can be used to integrate several film passive components in a multi-layer circuit board. In terms of the manufacturing process of multi-layer circuit board, the key factor lies in the ability of embedding the thick-film or thin film passive component of the kind in the circuit board during manufacturing process. The key factor is how to maintain the electrical precision the thin film passive component and reduce the variation with the original design after the thin film passive component is integrated into the multi-layer circuit board and is exemplified in Taiwanese Patent Publication No. 518616 "Manufacturing Method of a Multi-Layer Circuit Board with a Passive Component" disclosed on Jan. 21, 2003. Referring to FIG. 1A and FIG. 1B, a multi-layer circuit board with a passive component including a circuit thin plate 1 whose surface has a patterned circuit layer 2, a conductive foil 3, a resistor film 5, a passivation layer 7, and a preimpregnation material 9 is disclosed. The resistor film 5 is deposited on a slightly rough region on a smooth surface of the conductive foil 3 to have a better adhesion, and can be appropriately heated to become solidification. The slightly rough region can be defined according to photoresist micro-film etching, polishing, or other methods. The passivation layer 7 covers up the resistor film 5. The preimpregnation material 9 is located between the conductive foil 3 and the circuit thin plate 1. The circuit thin plate 1, the conductive foil 3, and the preimpregnation material 9 are stacked together according to a hot-pressing step.

However, the above methods must take into account the manufacturing process ability of the resistor or capacitor. For example, the printing area of the resistor must be carefully controlled, lest the printed resistor might vary with the designed value and cause bias to electrical precision. Therefore, the entire manufacturing process would become more complicated.

In the fields of close-to-mature technology, how to maintain electrical precision and at the same time simplify the manufacturing process for the current manufacturing process to better fit the needs of next generation products has become an urgent issue to be resolved.

SUMMARY OF THE INVENTION

With regards to the above issues, it is therefore a main object of the invention to provide a manufacturing method of a multi-layer circuit board with an embedded passive component and thereby simplify manufacturing process and enhance electrical precision.

Another object of the invention is to provide a manufacturing method of a multi-layer circuit board with an embedded passive component without considering the manufacturing process ability of the resistor or capacitor as well as the variation between the formed components and their designed values.

Another object of the invention is to provide a manufacturing method of a multi-layer circuit board with an embedded passive component, such as a resistor, capacitor, or inductor.

In order to achieve the above object, the manufacturing method of a multi-layer circuit board with an embedded passive component according to the invention includes providing a single layer plate, heating the single layer plate to melt the dielectric layer, pressing a passive component into the second surface of melting dielectric layer, stacking the single layer plate on a core substrate, stacking a second conductive foil on the single layer plate, and forming electrical pattern on the second conductive foil. The single layer plate includes a dielectric layer and a first conductive foil. The dielectric layer has a first surface and a second surface. The first conductive foil is disposed on the first surface.

Besides, the conducting circuit on the conductive foils of the top surface and the bottom surface of the core substrate can be mutually electrically conduct via at least a through hole formed on the core substrate.

Furthermore, the circuit pattern on the conductive foil can be electrically connected to the conducting circuit on the surface of the core substrate by the core substrate with surface circuit via the blind hole disposed on the insulation layer to form a multi-layer circuit board.

Moreover, the multi-layer circuit board can be a structure having a blind hole and a through hole and/or a buried hole.

Other objects, features, and advantages of the invention will become apparent from the following detailed description of the preferred but non-limiting embodiments. The following description is made with reference to the accompanying drawings. Anyone who is skilled in related technology would be able to understand and implement the technology accordingly.

DETAILED DESCRIPTION OF THE INVENTION

The following drawings and diagrams are not made according to actual scale, but for the purpose of brief explanation only. That is, these drawings and diagrams are unable to reflect the characteristics and features of various layers of a multi-layer circuit board.

Referring to FIG. 2A to FIG. 2E, cross-sectional views of the manufacturing process of a multi-layer circuit board embedded with a passive component according to a first preferred embodiment of the invention are shown.

Figure 1A:
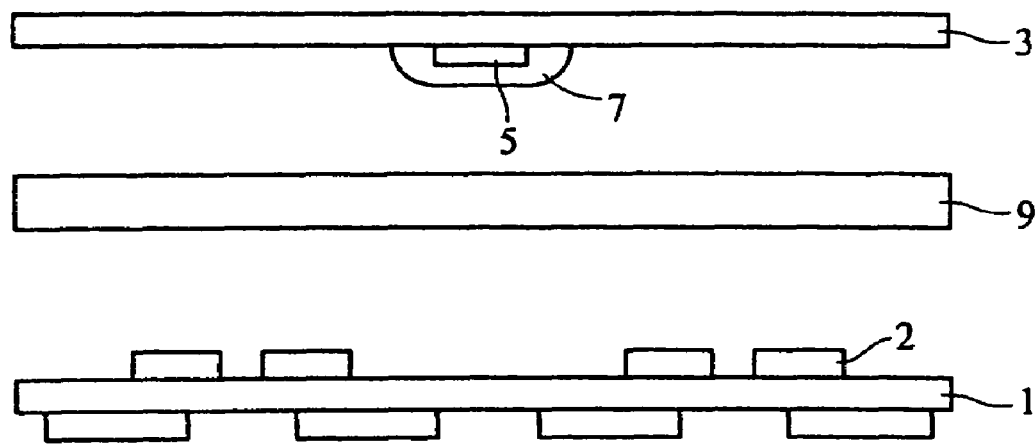
FIG. 1A to FIG. 1B (Prior Art) are cross-sectional views of the manufacturing process of a conventional multi-layer circuit board with a passive component.
Figure 1B:
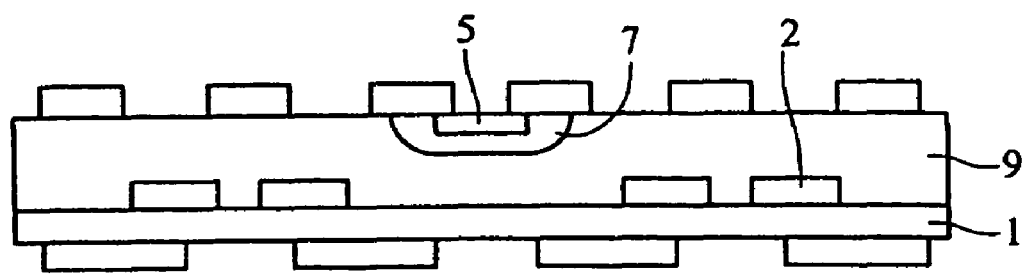
Figure 2A:
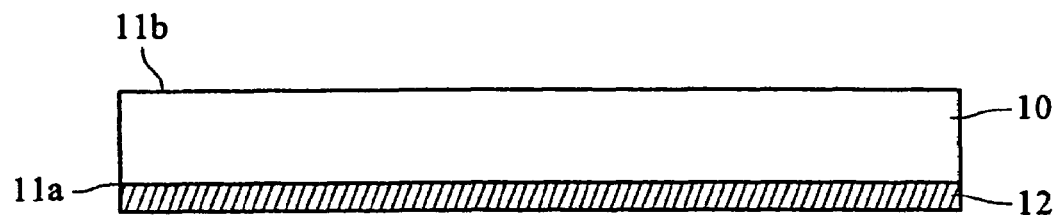
FIG. 2A to FIG. 2E are cross-sectional views of the manufacturing process of a multi-layer circuit board embedded with a passive component according to a first preferred embodiment of the invention.

As shown in FIG. 2A, at first a single layer plate is provided. The single layer plate includes a dielectric layer 10 and a first conductive foil 12. The dielectric layer 10 has a first surface 11a and a second surface 11b, and the first conductive foil 12 is disposed on the first surface 11a. The dielectric layer 10 is made of an insulating material, such as a resin dielectric material. The resin can be epoxy resin for instance. The first conductive foil 12 is made of copper, silver, aluminum, palladium or silver palladium, and is preferably made of copper foil.

Figure 2B:
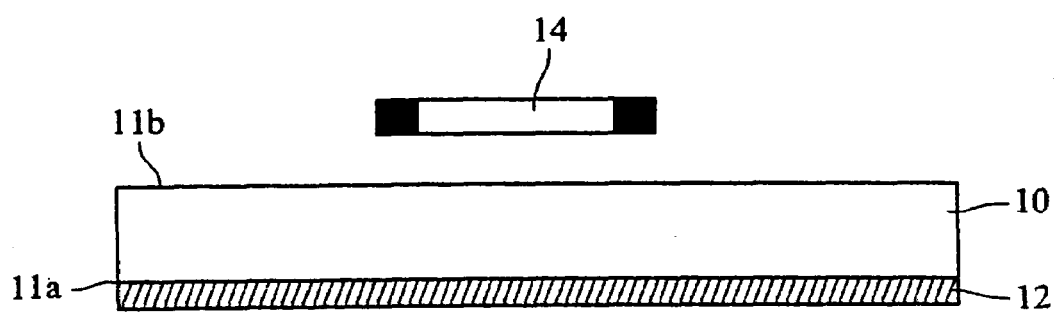

As shown in FIG. 2B, the single layer plate is heated for the dielectric layer 10 to be melted, and a passive component 14 is pressed into the melting dielectric layer 10 from the second surface 11b. During the hot-pressing procedure, the components must be aligned precisely. The above heating temperature is preferably 200° Celsius. The above passive component 14 can be a capacitor, a resistor, or an inductor.

Figure 2C:
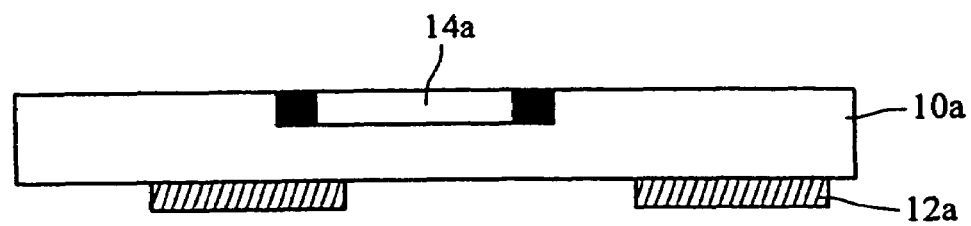

As shown in FIG. 2C, the first conductive foil 12 can be patterned to form a top surface circuit 12a on a surface of the core substrate or to be electrically connected to a circuit pattern on a surface of the core substrate.

Figure 2D:
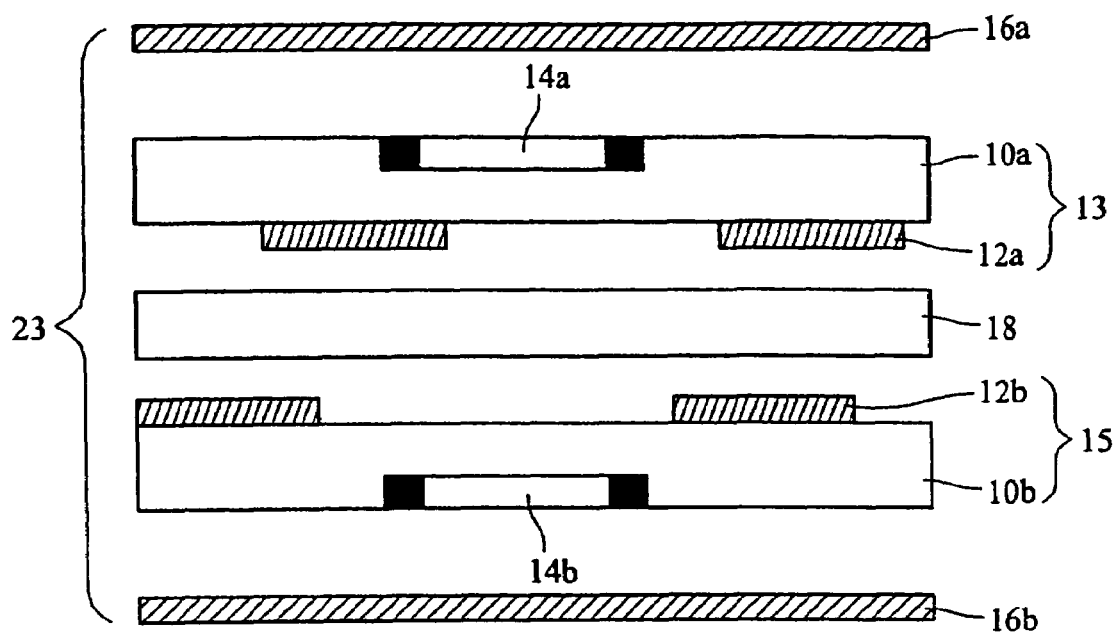

As shown in FIG. 2D, a core substrate 18, a first single layer plate 13 formed according to steps 2A to 2C, a second single layer plate 15 and two second conductive foils 16a and 16b formed according to steps 2A to 2C are illustrated.

The first single layer plate 13 is stacked on one side of the core substrate 18 first, then the second conductive foil 16a is stacked on the first single layer plate 13. Likewise, the second single layer plate 15 is stacked on another side of the core substrate 18 first, then the second conductive foil 16b is stacked on the second single layer plate 15. The first single layer plate 13 and the second single layer plate 15 are respectively located between the core substrate 18 and the second conductive foils (16a, 16b). The electrical pattern 12a, 12b are respectively positioned on the first single layer plate 13 and the second single layer plate 15 which contact the core substrate 18.

The above stacking procedure can be achieved via a hot-pressing step. During the procedure of hot-pressing, the dielectric layer is softened after being heated, so the metal circuit patterns are all embedded into the dielectric layer. The components must be aligned precisely.

The core substrate 18 illustrated in the above drawings and diagrams are the core substrate 18 without any pattern. However, in practical application, the core substrate 18 can be a metal circuit whose both surfaces are patterned, a double-layer circuit board or multi-layer circuit board. The core substrate 18 can be made of an insulated organic material or a ceramic material. For example, the epoxy resin, polyimide, dimaleatepolyimide resin, or other fiberglass composites, such as a conventional FR-4 substrate. The FR-4 substrate can be a substrate made of epoxy resin, fiberglass cloth or electroplated copper foil for instance. Nonetheless, the core substrate 19 is not limited to be made of one organic material only. The core substrate 19 can also be made of various insulation layers.

Figure 2E:
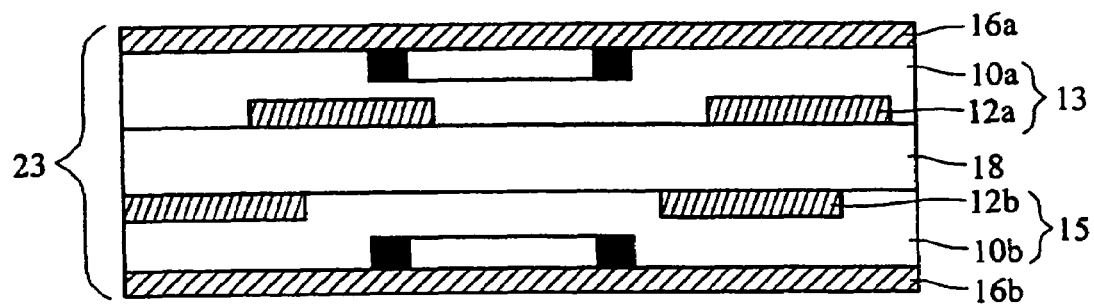

As shown in FIG. 2E, the multi-layer circuit board 23 deposited according to the stacking procedure includes a second conductive foil 16a, a first single layer plate 13 having a passive component 14a and an electrical pattern 12a, a core substrate 18, a second single layer plate 15 having a passive component 14b and an electrical pattern 12b, and a second conductive foil 16b in a top-down sequence. The two single layer plates illustrated in FIG. 2E only includes a passive component. In practical application, the two single layer plates can respectively include a plurality of passive components, or only one of the two single layer plates includes a passive component.

Figure 3A:
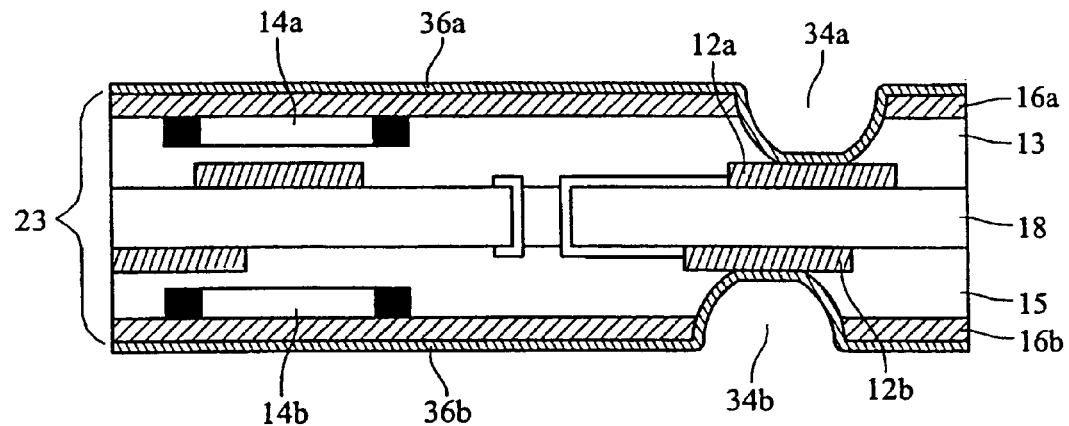
FIG. 3A and FIG. 3B are diagrams showing a preferred embodiment of forming a circuit pattern on a surface of a deposited multi-layer circuit board.
Figure 3B:
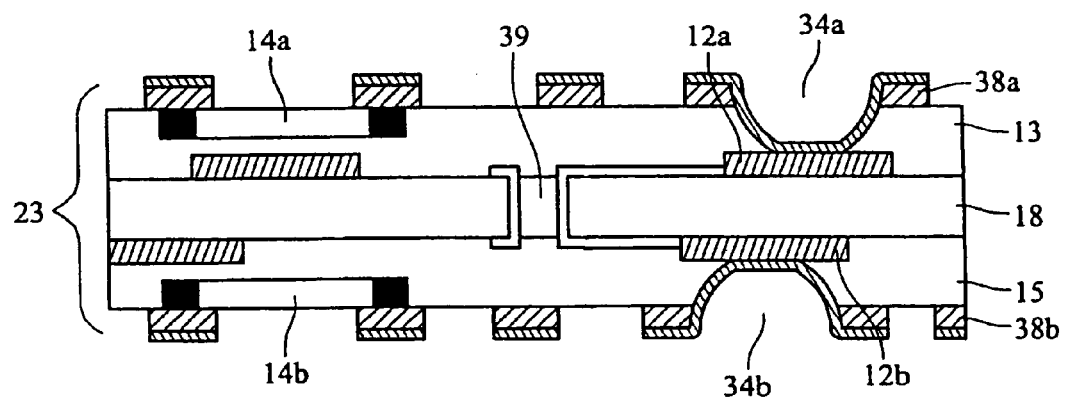

Besides, the multi-layer circuit board formed according to the above manufacturing process, the core substrate 18 can have the electrical patterns 12a and 12b on the top surface and the bottom surface respectively, or have an electrical pattern on either of the top surface and bottom surface only. So, an external electrical pattern electrically connected to the electrical pattern of the core substrate can be easily formed on an outer surface according to a method. Refer to FIG. 3A and FIG. 3B, which are diagrams showing a preferred embodiment of forming a circuit pattern on a surface of a deposited multi-layer circuit board.

As shown in FIG. 3A, the second conductive foil 16a and the first dielectric layer 10a on the top surface as well as the second conductive foil 16b and the second dielectric layer 10b on the bottom surface are respectively hollowed to form at least a blind hole 34a and a blind hole 34b for exposing the internal circuits (12a, 12b) of the first dielectric layer 10a and the second dielectric layer 10b respectively. Therefore, in the subsequent procedure of forming a circuit on the metal layer, the circuits (12a, 12b) can be electrically conducted via the blind holes (34a, 34b).

Next, a first metal layer 36a and a second metal layer 36b are respectively formed on the bottom surface of a multi-layer circuit board 23. The first metal layer 36a covers up the second conductive foil 16a and the inner wall of the blind hole 34a to be conducted with the circuit 12a inside the first dielectric layer 10a. The second metal layer 36b covers up the second conductive foil 16b and the inner wall of the blind hole 34b positioned on the bottom surface to be conducted with the circuit 12b inside the second dielectric layer 10b.

The first metal layer 36a or the second metal layer 36b can include copper. The method of forming a metal layer, a copper metal layer for instance, can be achieved by various methods such as physical vapor deposition (PVD), chemical vapor deposition (CVD), electroplated copper, non-plated copper, sputtering, evaporation, arc vapor deposition, ion beam sputtering, laser ablation deposition, plasma enhanced chemical vapor deposition (PECVD) or organic metal chemical vapor deposition and so forth. Preferably, a non-plating method is used first, and the copper metal layer is formed via plating afterwards.

As shown in FIG. 3B, the first metal layer 36a, the second metal layer 36b and conductive foil (16a, 16b) are respectively patterned to form electrical patterns (38a, 38b) electrically connected to the circuits (12a, 12b) inside the dielectric layer. In FIG. 3B, both of the two dielectric layers include an electrical pattern. However, in practical application, it is permitted that only one of the two dielectric layers has an electrical pattern disposed thereon. In FIG. 3B, both of the top metal layer and the bottom metal layer have an electrical pattern formed thereon. In practical application, it is permitted to from an electrical pattern on one of the metal layers corresponding to the electrical pattern inside the dielectric layer.

The deposited multi-layer circuit board 23 disclosed above can further include a buried hole 39 which is formed in the core substrate 18 and electrically connected to the blind holes 34a and 34b (the path for electrical connection is shown in FIGS. 3A and 3B).

Figure 4:
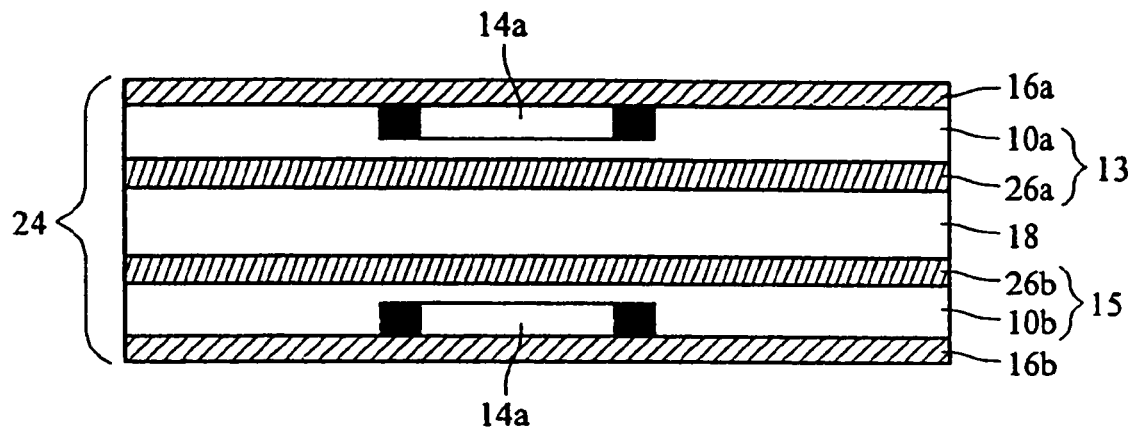
FIG. 4 is a cross-sectional view of a multi-layer circuit board with an embedded passive component according to a second preferred embodiment of the invention.

Besides, after the steps illustrated in FIG. 2B are completed, the first conductive foil 12 can be used for grounding without going through the patterning step, and other depositing steps are the same with that in the first preferred embodiment. The diagram of the deposited multi-layer circuit board is referred to FIG. 4. FIG. 4 is a cross-sectional view of a multi-layer circuit board with an embedded passive component according to a second preferred embodiment of the invention. Except that the first conductive foil 12 does not need to be patterned, the other steps and components are the same with that in the first preferred embodiment. Therefore, all the components but the first conductive foil would follow the same labeling system as previously did.

As shown in FIG. 4, the multi-layer circuit board 24 deposited according to a stacking procedure includes a second conductive foil 16a, a first single layer plate 13, a core substrate 18, a second single layer plate 13 and a second conductive foil 16b in a top-down sequence.

Figure 5A:
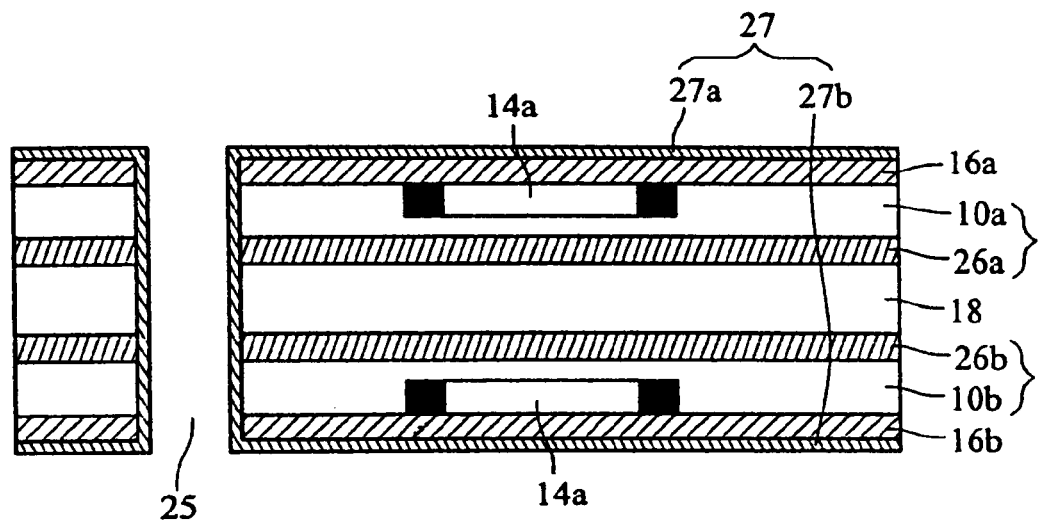
FIG. 5A and FIG. 5B are diagrams showing a preferred embodiment of forming a circuit pattern on a surface of a deposited multi-layer circuit board of FIG. 4.
Figure 5B:
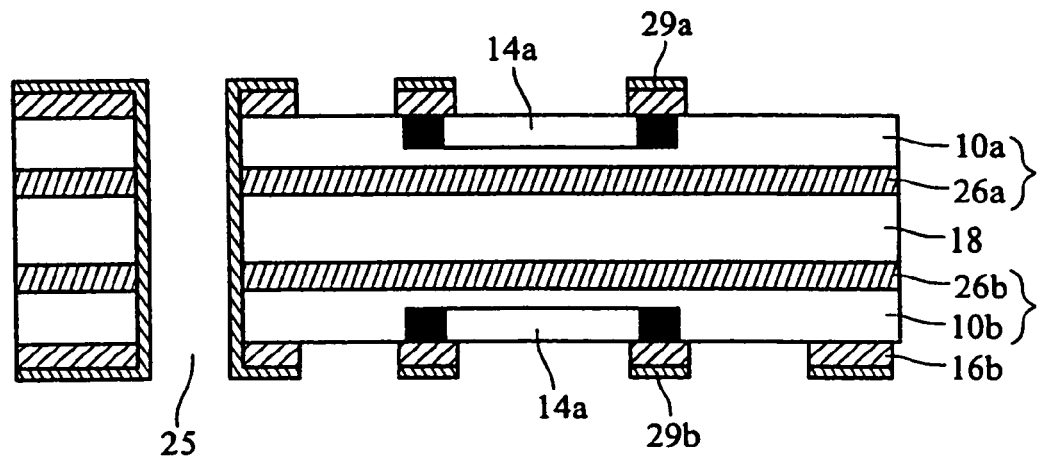

Referring to FIG. 5A and FIG. 5B, diagrams showing a preferred embodiment of forming a circuit pattern on a surface of a deposited multi-layer circuit board of FIG. 4 are shown.

As shown in FIG. 5A, the second conductive foil 16a and the second conductive foil 16b are hollowed to form at least a through hole 25, so that in the subsequent procedure of forming a circuit on the second conductive foil 16a and the second conductive foil 16b, the second conductive foil 16a and the second conductive foil 16b can be electrically connected to each other via the through holes 25. Next, a metal layer 27 is formed on the hole wall for conduction via hole, and the metal layers (27a, 27b) are respectively formed on the surface of the second conductive foil 16a and the surface of the second conductive foil 16b for the subsequent formation of electrical patterns. The metal layer 27 can include copper.

The method of forming the metal layer 27, a copper metal layer for instance, can be achieved by various methods such as physical vapor deposition (PVD), chemical vapor deposition (CVD), electroplated copper, non-plated copper, sputtering, evaporation, arc vapor deposition, ion beam sputtering, laser ablation deposition, plasma enhanced chemical vapor deposition (PECVD) or organic metal chemical vapor deposition and so forth. Preferably, a non-plating method is used first, and the copper metal layer is formed via plating afterwards.

As shown in FIG. 5B, the metal layers (27a, 27b) on the top and the bottom surfaces as well as the conductive foils (16a, 16b) positioned on the top and the bottom surfaces are patterned to form the electrical patterns (29a, 29b) respectively. The above procedure of patterning the metal layers (27a, 27b) on the top and the bottom surfaces as well as the conductive foils (16a, 16b) positioned on the top and the bottom surfaces to form the electrical patterns (29a, 29b) respectively can be achieved according to the conventional manufacturing process of plating a through hole, such as the subtractive method, the panel method. In FIG. 5B, both the top and the bottom conductive foils have an electrical pattern formed thereon. In practical application, the electrical pattern can be formed on only one of the conductive foils.

Figure 6:
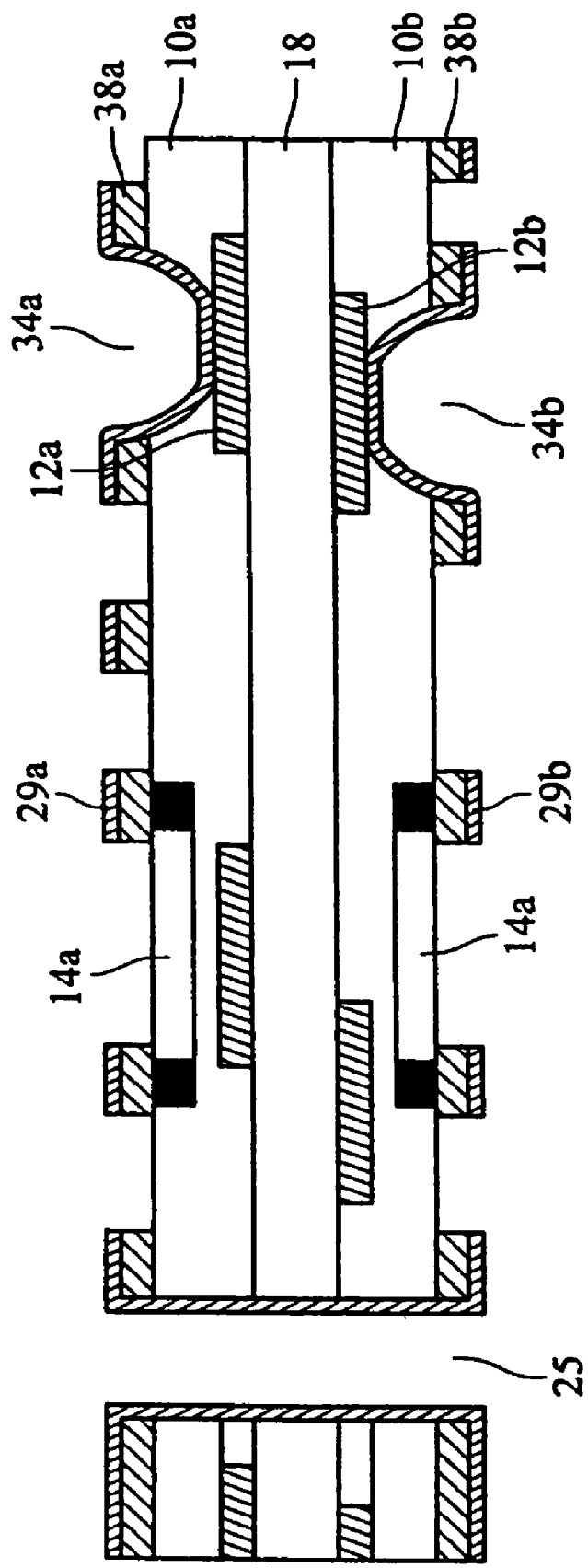
FIG. 6 shows another embodiment of forming a circuit pattern on a surface of a deposited multi-layer circuit board.

Besides, of the deposited multi-layer circuit board in FIG. 5A and FIG. 5B, the core substrate 18 can have the electrical pattern formed on both the top and the bottom surfaces, or on either of the top surface and bottom surface. The manufacturing process of forming a blind hole disclosed in FIG. 3A and FIG. 3B can be further added to the above manufacturing process of a through hole, so that an external electrical pattern electrically connected to the electrical pattern of the core substrate via the blind hole can be easily formed on an outer surface. Referring to FIG. 6, a diagram of another embodiment of forming a circuit pattern on a surface of a deposited multi-layer circuit board is shown.

Furthermore, the core substrate 18 of the deposited multi-layer circuit board of FIG. 5A and FIG. 5B can have an electrical pattern on both the top surface and the bottom surface, on either of the top surface and bottom surface. According to actual needs, the above manufacturing process of the through hole can be added to the manufacturing process of the buried hole and/or blind hole of FIG. 3A and FIG. 3B to form the buried hole or the blind hole.

According to the manufacturing method of a multi-layer circuit board with an embedded passive component according to the invention, hot-pressing is used to melt a single layer plate dielectric layer for a passive component to be pressed into the dielectric layer of the single layer plate without considering the printing size of the passive component, so that the complexity in the manufacturing process of forming the passive components is reduced and that the objects of simplifying the manufacturing process and enhancing electrical precision can also be achieved. Besides, the invention can also form at least a through hole on the core substrate for electrically connecting the conducting circuit on the conductive foils of the top with the bottom surface of the core substrate to form a multi-layer circuit board.

Moreover, the core substrate with surface circuit can electrically connect the circuit pattern on the conductive foil to the conducting circuit on the surface of the core substrate to form a multi-layer circuit board by forming the blind hole on the insulation layer. The conductive foil can create an insulation layer on the conductive foil to form at least a circuit layer by using build-up technology. The built-up circuit layer can be electrically connected to the conducting circuit on the conductive foil surface via the blind hole on the insulation layer of the conductive foil. The multi-layer circuit board can be applied to both a flip chip semiconductor package substrate and ordinary wire bonding semiconductor package substrate to simplify the manufacturing process and effectively reduce the manufacturing cost.

Therefore, the manufacturing method of a multi-layer circuit board with an embedded passive component according to the invention, without considering the manufacturing process ability of resistor or capacitor as well as the variation between the formed components and their designed values, provides the user a manufacturing method of a multi-layer circuit board that can be applied to various manufacturing processes, effectively simplify the manufacturing process and reduce the manufacturing cost.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A manufacturing method of a multi-layer circuit board with an embedded passive component, comprising:

providing a single layer plate having a dielectric layer and a first conductive foil, wherein the dielectric layer has a first surface and a second surface, the first conductive foil is disposed on the first surface for forming surface circuits;

heating the single layer plate to melt the dielectric layer;

pressing a passive component into the melting dielectric layer from the second surface of the dielectric layer so that the passive component is embedded into the melting dielectric layer and a top of the passive component is coplanar with the second surface;

stacking the single layer plate on a core substrate to press the surface circuits into the melting dielectric layer from the first surface of the dielectric layer so that the first surface contacts the core substrate;

stacking a second conductive foil on the single layer plate; and forming an electrical pattern on the second conductive foil.

2. The manufacturing method according to claim 1, wherein the first conductive foil is a copper foil.

3. The manufacturing method according to claim 1, wherein the second conductive foil is a copper foil.

4. The manufacturing method according to claim 1, wherein the passive component is selected from a group consisting of a capacitor, an inductor and a resistor.

5. The manufacturing method according to claim 1, wherein the core substrate is a double-layer circuit board.

6. The manufacturing method according to claim 1, wherein the core substrate is a multi-layer circuit board.

7. The manufacturing method according to claim 1, wherein the core substrate is made of an insulating material.

8. The manufacturing method according to claim 1, wherein the dielectric layer is made of epoxy resin.

9. The manufacturing method according to claim 1, wherein the step of stacking the single layer plate on the core substrate and the step of stacking the second conductive foil on the single layer plate use hot-pressing.

10. The manufacturing method according to claim 1, wherein the step of forming an electrical pattern on the second conductive foil comprises:

penetrating the second conductive foil, the single layer plate and the core substrate to form a through hole;

forming a metal layer on the second conductive foil and an inner wall of the through hole; and patterning the metal layer and the second conductive foil.

11. The manufacturing method according to claim 10, wherein the metal layer is made of copper.

12. The manufacturing method according to claim 1, wherein the step of forming an electrical pattern on the second conductive foil comprises:

penetrating the second conductive foil and the single layer plate to form a blind hole;

forming a metal layer on the second conductive foil and an inner wall of the blind hole; and patterning the metal layer and the second conductive foil.

13. The manufacturing method according to claim 12, wherein the metal layer is made of copper.

14. The manufacturing method according to claim 12, wherein the core substrate further comprises a buried hole electrically connected to the blind hole.

15. The manufacturing method according to claim 1, further comprising a step of patterning the first conductive foil to form another electrical pattern on the first conductive foil being between the step of pressing the passive component from the second surface into the melting dielectric layer and the step of stacking the single layer plate on the core substrate.

16. The manufacturing method according to claim 15, wherein the step of stacking the single layer plate on the core substrate is achieved via a hot-pressing step so that the another electrical pattern is embedded into the softened dielectric layer.

* * * * *